(12) United States Patent
Paul et al.

(10) Patent No.: US 11,131,642 B2
(45) Date of Patent: *Sep. 28, 2021

(54) CIRCUIT FOR DETERMINING THE CONDUCTIVITY OF A MEDIUM

(71) Applicant: Endress+Hauser Conducta GmbH+Co. KG, Gerlingen (DE)

(72) Inventors: Stefan Paul, Döbeln (DE); Erik Münz, Rossau (DE)

(73) Assignee: Endress+Hauser Conducta GmbH+Co. KG, Gerlingen (DE)

(*) Notice: Subject to any disclaimer, the term of this patent is extended or adjusted under 35 U.S.C. 154(b) by 506 days.

This patent is subject to a terminal disclaimer.

(21) Appl. No.: 16/132,737

(22) Filed: Sep. 17, 2018

(65) Prior Publication Data

US 2019/0011387 A1 Jan. 10, 2019

Related U.S. Application Data

(62) Division of application No. 15/238,982, filed on Aug. 17, 2016, now Pat. No. 10,101,290.

(30) Foreign Application Priority Data

Aug. 21, 2015 (DE) ..................... 10 2015 113 922.7

(51) Int. Cl.
*G01N 27/06* (2006.01)
*G01R 27/22* (2006.01)
*G01R 35/00* (2006.01)
*G01R 17/00* (2006.01)
*G01R 27/02* (2006.01)
*G01R 27/28* (2006.01)

(52) U.S. Cl.
CPC ............. *G01N 27/06* (2013.01); *G01R 17/00* (2013.01); *G01R 27/02* (2013.01); *G01R 27/22* (2013.01); *G01R 27/28* (2013.01); *G01R 35/005* (2013.01)

(58) Field of Classification Search
CPC ...... G01N 27/06; G01R 27/22; G01R 35/005; G01R 17/00; G01R 27/02; G01R 27/28
See application file for complete search history.

(56) References Cited

U.S. PATENT DOCUMENTS 10,101,290 B2 * 10/2018 Paul .................. G01N 27/06
2008/0297173 A1 * 12/2008 Zhou .................. G01R 27/22
324/663

FOREIGN PATENT DOCUMENTS

CN 103543422 A 1/2014
CN 204536424 U 8/2015
WO 2013183870 A1 12/2013

* cited by examiner

Primary Examiner — Amy He
(74) Attorney, Agent, or Firm — Mark A. Logan; Endress+Hauser (USA) Holding Inc.

(57) ABSTRACT

The present disclosure relates to a measuring circuit for a conductivity sensor, wherein the measuring circuit includes a built-in reference circuit and multiple built-in measuring ranges.

10 Claims, 1 Drawing Sheet

CIRCUIT FOR DETERMINING THE CONDUCTIVITY OF A MEDIUM

CROSS-REFERENCE TO RELATED APPLICATION

The present divisional application is related to and claims the priority benefit of U.S. patent application Ser. No. 15/238,982, filed Aug. 17, 2016 and German Patent Application No. 10 2015 113 922.7, filed on Aug. 21, 2015, the entire contents of which are incorporated herein by reference.

TECHNICAL FIELD

The present disclosure relates to a method for determining the conductivity of a medium by means of a conductive conductivity sensor.

BACKGROUND

A conductivity sensor includes a measuring circuit for measuring the electrical conductivity of a medium based upon a resistance measurement of the medium and the subsequent calculation with a factor that is referred to as a cell constant and results from the geometry of the conductivity sensor. Typically, the measuring circuits for a conductivity sensor are adjusted during the production. In the process, errors, such as amplification and zero point errors, are determined, and correction values, if any, are stored in the non-volatile memory. Such an adjustment usually occurs at room temperature, since a change in the temperature is difficult to implement during the adjustment. Such a conductivity sensor is operated at the customer's premises for a time period of many years and is there exposed to various environmental conditions, such as humidity and temperature fluctuations.

The correction values for the measuring circuit are determined at a point in time when defined environmental conditions, such as temperature, prevail. As a result of molding of the measuring circuit from, for example, epoxy resin, temperature fluctuations, or aging over a long period of operation, deviations in the measuring chain of the measuring circuit can occur. These deviations may possibly impair the specified measurement precision of the conductivity sensor.

BRIEF SUMMARY OF THE INVENTION

The present disclosure includes a method for determining the conductivity of a medium by means of a conductive conductivity sensor with high measurement precision.

The object of the present disclosure is a method for determining the conductivity of a medium by means of a conductive conductivity sensor, comprising the steps of determining measured values of the conductivity sensor, determining reference measured values of a reference circuit integrated into the conductivity sensor, deriving at least one adjustment value from the reference measured values of the reference circuit, correcting the measured values of the conductivity sensor by means of the at least one adjustment value.

The solution according to the present disclosure is advantageous in that the reference circuit is integrated into the conductivity sensor (on-board adjustment) for automatic adjustment. With suitable algorithms and timed sequences, it is then possible to adjust the conductivity sensor during the measurement operation, to determine correction values and to always ensure an optimal measurement performance. Another advantage of the on-board adjustment is the diagnosis of malfunctions of certain circuit components. This may be realized by comparing the determined adjustment values with theoretical ideal values for the adjustment. If the determined correction values deviate too much from the theoretical values, a malfunction of the conductivity sensor exists, and the superordinate system may react accordingly.

According to at least one embodiment, a time-controlled alternation between the determination of the measured values of the conductivity sensor and the determination of the reference measured values of the reference circuit takes place. As a result of the cyclical adjustment of the conductivity sensor, medium-term changes of faulty components may be determined and adjusted. For example, the temperature influences on resistors and other components over time can be adjusted thereby.

According to an embodiment, two measured values of the conductivity sensor and, subsequently, one reference measured value of the reference circuit are determined.

According to another embodiment, the conductivity sensor comprises an electronic circuit with at least two measurement ranges. The electronic circuit is able to select its measuring range from the at least two measurement ranges by selecting an internal resistance of the electronic circuit. The selection of the internal resistance allows the electronic circuit to best match its internal resistance with the expected resistance of the medium to obtain the best measurement precision. An active measurement range is the range (i.e., the internal resistance) currently in use by the electronic circuit for conductivity measurements. During a measurement, adjustments are made more frequently in the active measurement range than in the other measurement range(s).

Since the electronic circuit may have several measurement ranges, it is expedient to adjust the currently active measurement range more frequently, in order to ensure the highest precision and best performance. If the other measurement ranges were, however, ignored, inaccuracies could occur over a longer period of time. This would, in particular, be the case if the temperature of the electronic circuit were to change while a measurement range is active. If the change to a different measurement range occurs at that time, the adjustment value would no longer be current in this range, and incorrect measured values would be determined. After a certain period of time, the error would be minimized, since the other measurement ranges are also adjusted.

BRIEF DESCRIPTION OF THE DRAWINGS

The described embodiments and other features, advantages and disclosures contained herein, and the manner of attaining them, will become apparent and the present disclosure will be better understood by reference to the following description of various exemplary embodiments of the present disclosure taken in conjunction with the accompanying drawings, wherein.

Figure 1:
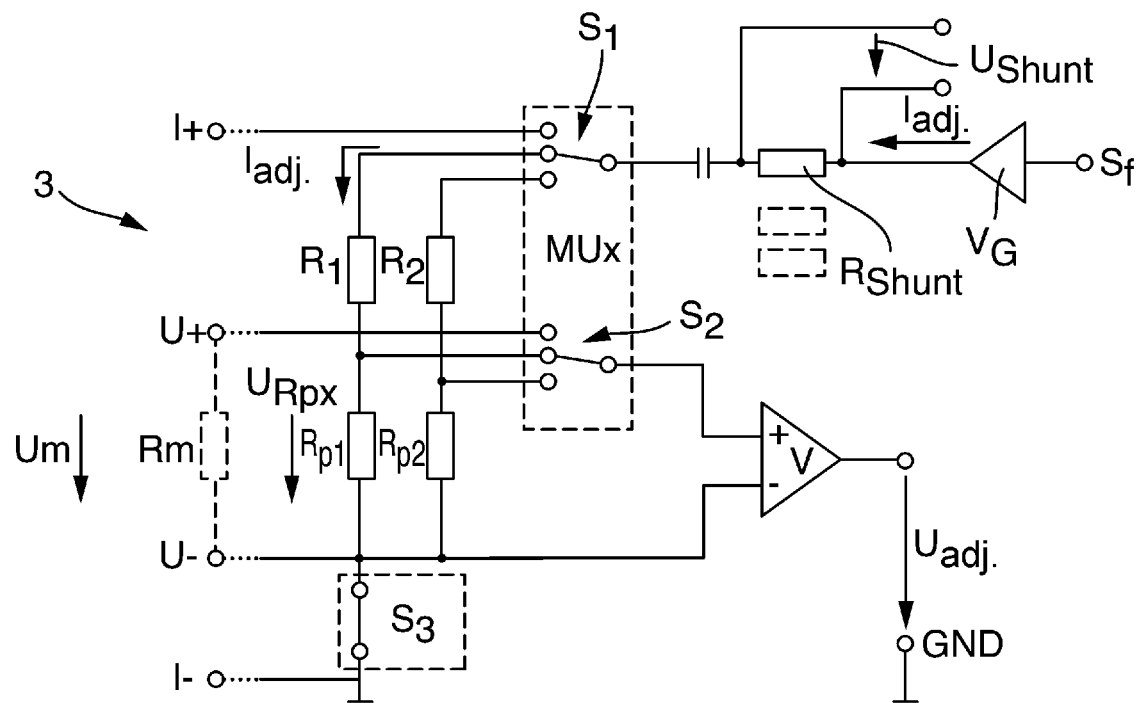
FIG. 1 shows a measuring circuit for measuring conductivity with an integrated reference circuit according to exemplary embodiments of the present disclosure.

Like reference numerals indicate the same or similar parts throughout the several figures. It should be appreciated that not all of the features of the components of the figures are necessarily described. Some of these non-discussed features, such as various fasteners, etc., as well as discussed features are inherent from the figures. Other non-discussed features may be inherent in component geometry or configuration.

DETAILED DESCRIPTION

FIG. 1 shows a measuring circuit 3 for measuring conductivity with an integrated reference circuit. The measuring circuit 3 is operated by means of a signal generator (not shown) that provides a signal $S_f$ with a frequency f. A generator amplifier VG amplifies the signal $S_f$ and generates an adjustment current $I_{adj}$. The adjustment current $I_{adj}$ flows through a shunt resistor $R_{shunt}$ and generates a shunt voltage $U_{shunt}$. If the shunt voltage $U_{shunt}$ and the shunt resistor $R_{shunt}$ are known, the adjustment current $I_{adj}$ can be determined:

$$I_{adj.} = \frac{U_{shunt}}{R_{shunt}}$$

Through the shunt resistor $R_{shunt}$, the adjustment current $I_{adj}$ flows to a multiplexer MUX that comprises two switches $S_1$ and $S_2$. Both switches $S_1$, $S_2$ comprise three positions and are synchronized, which means that if the top switch $S_1$ is in the center position, the bottom switch $S_2$ is also in the center position, etc. Connected to the MUX are voltage dividers, one voltage divider including the resistors $R_1$ and $R_{p1}$, the other voltage divider including the resistors $R_2$ and $R_{p2}$. If both switches $S_1$, $S_2$ are in the center position, the adjustment current $I_{adj}$ flows through voltage divider $R_1$ and $R_{p1}$ via a third closed switch $S_3$ to ground and generates a voltage $U_{Rpx}$ along $R_{p1}$:

$$U_{Rpx} = R_{p1} \cdot I_{adj.}$$

The voltage $U_{Rpx}$ is amplified by means of an amplifier V, wherein the amplification factor v is determined as follows:

$$v = \frac{U_{adj.}}{U_{Rpx}}$$

If the resistors $R_{shunt}$ and $R_{p1}$ are dimensioned as follows:

$$R_{shunt} = 100\,\Omega\ R_{p1} = 390\,\Omega,$$

and if, for example, the following values are measured for the shunt voltage $U_{shunt}$ and the adjustment voltage $U_{adj}$:

$$U_{shunt} = 100\text{ mV}\ U_{adj} = 2\text{ V},$$

then the result for $I_{adj}$, $U_{Rpx}$, and v is:

$$I_{adj.} = \frac{U_{shunt}}{R_{shunt}} = \frac{100\text{ mV}}{100\ \Omega} = 1\text{ mA}$$

$$U_{Rpx} = R_{p1} \cdot I_{adj.} = 390\ \Omega \cdot 1\text{ mA} = 390\text{ mV}$$

$$v = \frac{2\text{ V}}{0.39\text{ V}} = \underline{5.128}$$

If both switches of the multiplexer MUX are in the top position, the adjustment current $I_{adj}$ flows via two current electrodes I+, I− through the medium, and a measured value of the conductivity sensor is determined. The current electrodes I+ and I−, together with the two voltage electrodes U+, U−, constitute the four poles of the four-terminal measurement of the conductivity sensor. During the measurement of the medium, the switch $S_3$ is open and connected to a separate ground, so that the voltage electrode U− is not short-circuited with the current electrode I−.

If the medium between the voltage electrodes U+ and U− is represented by a medium resistance $R_m$, the voltage $U_m$ between the voltage electrodes U+ and U− decreases. The current $I_m$ (not shown in the drawing) is regulated until the current $I_m$ through the medium is equal to the adjustment current $I_{adj}$ (see above). In this example, the following values were measured for the shunt voltage $U_{shunt}$ and the adjustment voltage $U_{adj}$, after the switches were changed from the center to the top position:

$$U_{shunt} = 80\text{ mV}\ U_{adj} = 1\text{ V}$$

Thus, the medium resistance $R_m$ can be determined as follows, by means of the amplification factor v=5.128:

$$I_m = \frac{U_{shunt}}{R_{shunt}} = \frac{80\text{ mV}}{100\ \Omega} = 0.8\text{ mA}$$

$$U_m = \frac{U_{adj.}}{v} = \frac{1\text{ V}}{5.128} = 195\text{ mV}$$

$$R_m = \frac{U_m}{I_m} = \frac{0.195\text{ V}}{0.8\text{ mA}} = \underline{243.76\ \Omega}$$

With an on-board adjustment, the conditions are, therefore, adjusted exactly in the same way as they are adjusted in a medium measurement (amplitude, frequency, shunt resistor, amplification). The goal of the adjustment is the calculation of the amplification factor v of the amplifier V. With the adjustment current $I_{adj}$, the ideal voltage drop $U_{Rpx}$ through the resistor $R_{p1}$ can be calculated. With the measured adjustment voltage $U_{adj}$, the amplification factor v can be calculated. The amplification factor v compensates for all errors of the measuring circuit 3. If the current flow is subsequently directed through the medium again, the same conditions prevail as during the adjustment of the measurement range. However, the current flow is corrected or adjusted by means of the determined amplification factor v.

As shown by the dashed-line boxes below $R_{shunt}$ in FIG. 1, the measuring circuit 3 may use optional values for $R_{shunt}$ to effect different measurement ranges. That is, the selection of a measurement range is effected by selecting a value for $R_{shunt}$ to be used by the measuring circuit 3. For example, if it is expected the medium resistance $R_m$ will be low, a measurement range will be selected such that the selected $R_{shunt}$ will obtain the most precise measurements in the high conductive medium. Likewise, if it is expected the medium resistance $R_m$ will be high, a measurement range will be selected such that the selected $R_{shunt}$ will obtain the most precise measurements in the low conductive medium. Therefore, the active measuring range, i.e., the measuring range to be used by the conductivity sensor during a medium measurement, will be selected based on the expected resistance/conductivity of the medium to be measured.

Figure 2:
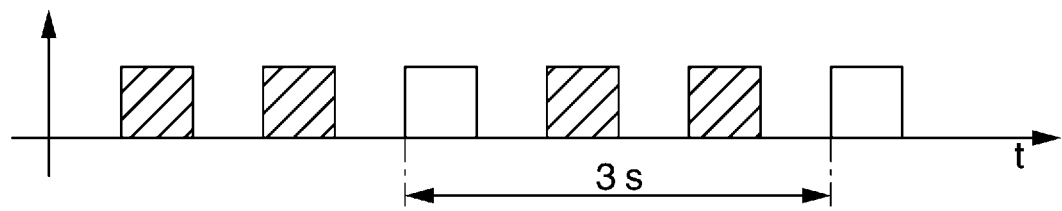
FIG. 2 depicts a sequence of medium and adjustment measurements according to exemplary embodiments of the present disclosure.

FIG. 2 shows a sequence of medium and adjustment measurements. The medium and adjustment measurements each last for half a second and occur once per second each. One adjustment measurement follows two medium measurements.

Figure 3:
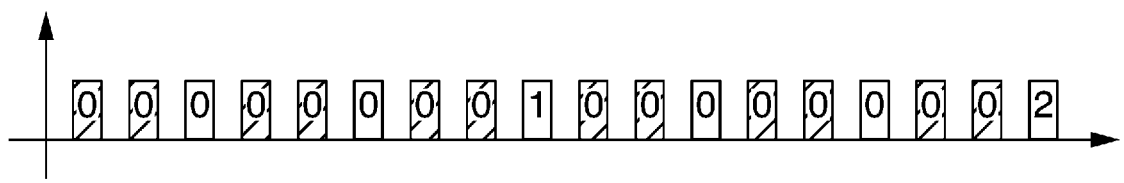
FIG. 3 depicts a sequence of medium and adjustment measurements in various measurement ranges according to exemplary embodiments of the present disclosure.

FIG. 3 shows a sequence of medium and adjustment measurements in accordance with FIG. 2, in which the medium and adjustment measurements occur in different measurement ranges 0, 1, and 2. The measurement range 0, in which the current conductivity measurement occurs, is adjusted more frequently than the measurement ranges 1 and 2. If the measurement range is changed from 0 to 1, the adjustment values for measurement range 1 are available and can be provided immediately, in order to ensure optimal measurement performance.

What is claimed is:

1. A measuring circuit for measuring the conductivity of a medium, comprising:
   a first circuit input;
   a first resistor having a first end and a second end, wherein the first end of the first resistor is connected to the first circuit input;
   a first switch having an input, a first output, and a second output, wherein the first switch is adapted to switch a connection between the input of the first switch and the first output of the first switch to a connection between the input of the first switch and the second output of the first switch, wherein the input of the first switch is connected to the second end of the first resistor;
   a first circuit port connected to the first output of the first switch;
   a second resistor having a first end and a second end, wherein the first end of the second resistor is connected to the second output of the first switch;
   a second circuit port;
   a third circuit port;
   a second switch having a first input, a second input, and an output, wherein the second switch is adapted to switch a connection between the first input of the second switch and the output of the second switch to a connection between the second input of the second switch and the output of the second switch, wherein the first input of the second switch is connected to the second circuit port, wherein the second input of the second switch is connected to the second end of the second resistor, and wherein the output of the second switch is connected to the third circuit port;
   a third resistor having a first end and a second end, wherein the first end of the third resistor is connected to the second end of the second resistor;
   a fourth circuit port connected to the second end of the third resistor;
   a fifth circuit port;
   a circuit reference point;
   a third switch having an input and an output, wherein the third switch is adapted to open a connection between the input of the third switch and the output of the third switch, wherein the input of the third switch is connected to the second end of the third resistor, and wherein the output of the third switch is connected to the fifth circuit port and the circuit reference point; and
   a sixth circuit port connected to the second end of the third resistor.

2. The measuring circuit according to claim 1, further comprising:
   a seventh circuit port; and
   an amplifier having a first input, a second input and an output,
   wherein the first input of the amplifier is connected to the output of the second switch, the second input of the amplifier is connected to the sixth circuit port, and the output of the amplifier is connected to the seventh circuit port.

3. The measuring circuit according to claim 1, wherein the first resistor is adapted to be exchanged with a fourth resistor,
   wherein the first switch further has a third output, wherein the first switch is adapted to switch a connection between the input of the first switch and the first output of the first switch to a connection between the input of the first switch and the second output of the first switch or to a connection between the input of the first switch and the third output of the first switch,
   wherein the measuring circuit further comprises a fifth resistor having a first end and a second end, wherein the first end of the fifth resistor is connected to the third output of the first switch,
   wherein the measuring circuit further comprises a sixth resistor having a first end and a second end, wherein the first end of the sixth resistor is connected to the second end of the fifth resistor and wherein the second end of the sixth resistor is connected to the fourth circuit port, and
   wherein the second switch further has a third input, wherein the second switch is adapted to switch a connection between the first input of the second switch and the output of the second switch to a connection between the second input of the second switch and the output of the second switch or to a connection between the third input of the second switch and the output of the second switch, wherein the third input of the second switch is connected to the second end of the fifth resistor.

4. The measuring circuit according to claim 1, further comprising:
   a capacitor arranged between the second end of the first resistor and the input of the first switch.

5. The measuring circuit according to claim 1, wherein the first switch and the second switch are embodied as a multiplexer.

6. A measuring circuit, comprising:
   a signal input;
   a first amplifier circuit having an input connected to the signal input and further having an output;
   a shunt resistor having a first end and a second end, the first end connected to the amplifier circuit output;
   a first switch having an input and two outputs, wherein the first switch is configured as a single-pole, double-throw switch, and wherein the input of the first switch is connected to the second end of the shunt resistor;
   a first voltage divider having a first resistor and a second resistor, wherein a first end of the first voltage divider is connected to a second output of the first switch;
   a second switch having two inputs and an output, wherein the second switch is configured as a single-pole, double-throw switch, and wherein a second input of the second switch is connected to the first voltage divider between the first resistor and the second resistor;
   a second amplifier circuit having two inputs and an output, wherein the first input of the second amplifier circuit is connected to the output of the second switch;
   a first voltage electrode connected to a first input of the second switch, and a second voltage electrode connected to a second input of the second amplifier;
   a first current electrode connected to the first output of the first switch, and a second current electrode connected to a ground; and
   a third switch having an input and an output, wherein the third switch is configured as a single-pole, single-throw switch, and wherein the input of the third switch is connected to the second input of the second amplifier and the output of the third switch is connected to the ground, wherein a second end of the first voltage divider is connected to the second input of the second amplifier circuit, wherein the first switch and the second switch are configured to switch synchronously such that when the first switch is switched to a throw position, the second switch is switched to the corresponding throw position, wherein when the first switch is switched to its first output and the second switch is switched to its first input, the third switch is open, and wherein when the first switch is not switched to its first output and the second switch is not switched to its first input, the third switch is closed.

7. The measuring circuit according to claim 6, wherein the shunt resistor includes a switchable resistance having a plurality of fixed resistance values, wherein the value of the shunt resistance is selectable from the plurality of fixed resistance values.

8. The measuring circuit according to claim 7, wherein the first switch further has a third output and is configured as a single-pole, triple-throw switch, and wherein the second switch further has a third input and is configured as a single-pole, triple-throw switch, the measuring circuit further comprising:

a second voltage divider having a first resistor and a second resistor, wherein a first end of the second voltage divider is connected to a third output of the first switch and a second end of the second voltage divider is connected to the second input of the second amplifier circuit, and wherein the third input of the second switch is connected to the second voltage divider between the first resistor and the second resistor.

9. The measuring circuit according to claim 6, further comprising:

a capacitor connected in series between the second end the shunt resistor and the input of the first switch.

10. The measuring circuit according to claim 6, wherein the first switch and the second switch are embodied in a multiplexer.

* * * * *